United States Patent [19]

Miller

[11] Patent Number: 5,501,436
[45] Date of Patent: Mar. 26, 1996

[54] SUBSTRATE RETENTION FIXTURE

[76] Inventor: Dennis K. Miller, 1517 W. Knowles Cir., Mesa, Ariz. 85202

[21] Appl. No.: 220,210

[22] Filed: Mar. 30, 1994

[51] Int. Cl.$^6$ ..................................... B23Q 1/00
[52] U.S. Cl. ................ 269/47; 269/289 R; 269/254 CS; 269/903; 269/305
[58] Field of Search ............ 269/254 CS, 254 R, 269/47, 903, 52, 289 R, 303, 304, 305, 315, 319

[56] References Cited

U.S. PATENT DOCUMENTS

| | | | |
|---|---|---|---|
| 2,952,282 | 9/1960 | McHenry | 269/254 CS |
| 3,088,729 | 5/1963 | Marcus | 269/254 CS |
| 4,255,077 | 3/1981 | Smith | 269/254 CS |
| 4,646,418 | 3/1987 | Hattori | 269/254 CS |
| 4,703,920 | 11/1987 | Grabbe et al. | 269/903 |
| 4,759,488 | 7/1988 | Robinson et al. | 269/903 |
| 4,971,676 | 11/1990 | Dove et al. | 269/903 |
| 5,005,814 | 4/1991 | Gumbert | 269/903 |

*Primary Examiner*—Robert C. Watson
*Attorney, Agent, or Firm*—Jordan M. Meschkow; Lowell W. Gresham; Mark M. Takahashi

[57] ABSTRACT

A substrate retention fixture including a base formed of a relatively flat plate with major surfaces and a substrate receiving area formed in one surface thereof with a plurality of openings adjacent the area and in communication therewith. A plurality of spools, one each positioned in each opening, and slideably mounted within the opening for movement between a substrate disengaged and a substrate engaged position. A plurality of springs, one each positioned in each opening, with the spring in each opening engaged with the spool in the opening and biasing the spool into the substrate engaged position. Alignment pins formed to engage and align a substrate positioned in the area, the alignment pins being mounted on one of the base and the plurality of spools.

14 Claims, 3 Drawing Sheets

SUBSTRATE RETENTION FIXTURE

BACKGROUND OF THE INVENTION

1. Field of the Invention

This invention relates to fixtures for retaining electronic substrates during various assembly and test operations.

More particularly, the present invention relates to a construction of the fixtures which simplifies the fabrication and use.

In a further and more specific aspect, the instant invention concerns an improved substrate retention fixture and the use of the fixture in various assembly and testing operations for flat substrates and the like.

2. Prior Art

In general, assembly and test operations on substrates, such as printed circuit boards, hybrid circuits, etc. are performed either manually or automatically. Because of the large number and complexity of circuitry and components being positioned on substrates at the present time (and the trend for this to increase in the future), there is a definite advantage in performing the assembly and test operations, or as much as possible, automatically.

One major problem that arises during either manual or automatic operations is damage to the substrate. Most substrates are positioned by alignment pins which engage alignment holes on the substrate or by accurately formed edges of the substrate. In either case, if the substrate is aligned and moved often the holes and/or alignment edges have a tendency to wear, nick, or otherwise become damaged. Once such damage occurs further automatic (and in some instances manual) operations may become either very difficult or impossible.

Another problem arises when a variety of different sized or shaped substrate are being operated upon. In many instances it is very difficult to modify the assembly line, especially automatic assembly lines, to accept different sized and/or shaped substrate.

In the prior art, to at least partially overcome some of these problems work holders have been devised to grip a substrate and hold it during one or more operations. As a specific example, work holders have been devised to hold printed circuit boards during passage through flow solder machines. One major problem with these prior art work holders is that they are designed for a specific operation and the printed circuit boards must be removed after the operation (flow soldering in this example) is completed.

A second problem that is prevalent in prior art work holding devices is the extreme complexity involved in both the fabrication of the work holding device and in the use of the work holding device. Generally, the prior art work holding devices are constructed with relatively large and involved levers or sliding and locking components. In the case of levers, the substrate is positioned in the work holding device and then a plurality of levers are twisted or otherwise moved manually to lock the substrate in place. Sliding and locking components generally take the shape of entire edges that slide on a base member to engage a correctly positioned substrate. The sliding edge or other component is then locked in place by means of locking levers, screws, or other complicated locking mechanisms.

It would be highly advantageous, therefore, to remedy the foregoing and other deficiencies inherent in the prior art.

Accordingly, it is an object of the present invention to provide an improved substrate retention fixture.

Another object of the present invention is to provide an improved substrate retention fixture that is relatively simple to operate.

And another object of the present invention is to provide an improved substrate retention fixture that can be used to retain substrates with different sizes and shapes.

Still another object of the present invention is to provide an improved substrate retention fixture which is simpler to fabricate than other work holders.

Yet another object of the present invention is to provide an improved substrate retention fixture which is lighter than prior art work holders.

And still another object of the present invention is to provide an improved substrate retention fixture which is less expensive to fabricate and use than prior art work holders.

A further object of the present invention is the provision of an improved substrate retention fixture which can be used with a variety of modern automated machines.

And a further object of the present invention is the provision of an improved substrate retention fixture which is more versatile than prior art work holders.

Another object of the present invention is to provide an improved substrate retention fixture which will retain the substrate securely without extending mechanisms above the top surface of the substrates.

And another object of the present invention is the provision of a fixture to pull thin flexible substrates flat, which may otherwise be bowed or curled in their free state.

SUMMARY OF THE INVENTION

Briefly, to achieve the desired objects of the instant invention, in accordance with a preferred embodiment thereof, a substrate retention fixture is disclosed which includes a base having a substrate receiving area therein with a plurality of openings adjacent the area and in communication therewith. A plurality of spools are included, one each positioned in each opening of the plurality of openings, with each spool being slideably mounted within the opening for movement between a first position in which the spool is disengaged from a substrate positioned in the area and a second position in which at least an edge of the spool is frictionally engaged with a substrate positioned in the area. A plurality of springs are positioned, one each in each opening of the plurality of openings, so that the spring in each opening is engaged with the spool in the opening and biases the spool into the second position.

In accordance with a further embodiment of the invention, a method of performing operations on a substrate is disclosed including the step of providing a substrate retention fixture including a base formed of a relatively flat plate having upper and lower major surfaces, the base further having a substrate receiving area formed in the upper major surface thereof with a plurality of openings adjacent the area and in communication therewith, a plurality of spools, one each positioned in each opening of the plurality of openings, with each spool being slideably mounted within the opening for movement between a first position in which the spool is disengaged from a substrate positioned in the area and a second position in which at least an edge of the spool is frictionally engaged with a substrate positioned in the area, a plurality of springs, one each positioned in each opening of the plurality of openings, the spring in each opening engaged with the spool in the opening and biasing the spool into the second position, and alignment means formed to engage and align a substrate positioned in the area, the alignment means being mounted on one of the base and the plurality of spools. The method further includes the steps of selecting a compatible substrate with alignment holes formed therein, roughly positioning the selected substrate in the area of the base with the alignment holes of the substrate engaged with the alignment means, moving the plurality of spools to the first position, positioning the selected substrate in the area of the base in an aligned position and allowing the plurality of spools to move to the second position in which at least an edge of each of the spools is frictionally engaged with the substrate positioned in the area; and performing desired operating on the substrate.

BRIEF DESCRIPTION OF THE DRAWINGS

The foregoing and further and more specific objects and advantages of the instant invention will become readily apparent to those skilled in the art from the following detailed description of preferred embodiments thereof taken in conjunction with the drawings in which.

DETAILED DESCRIPTION OF THE PREFERRED EMBODIMENTS

Figure 1:
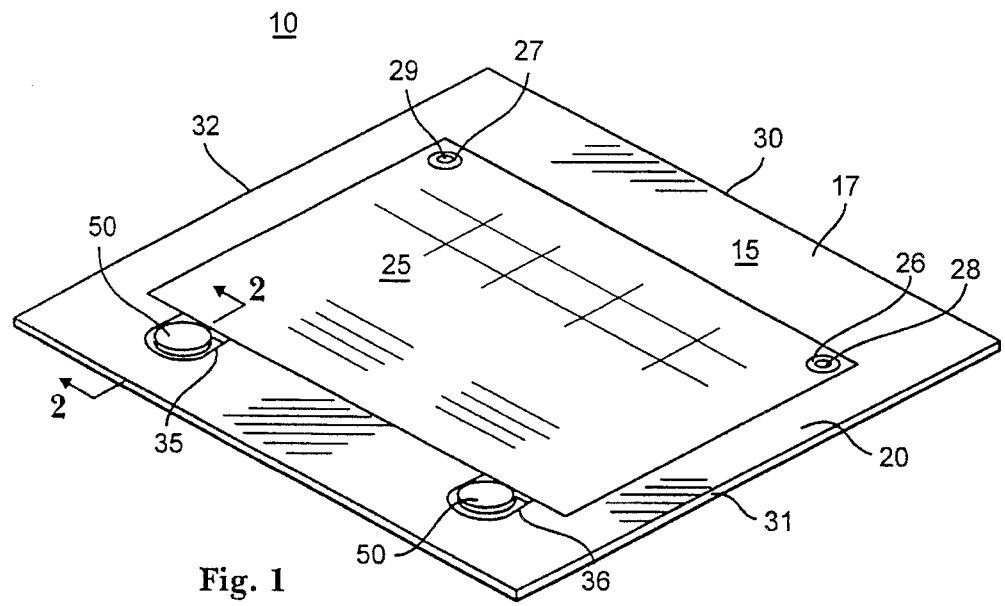
FIG. 1 is a perspective view of a substrate retention fixture constructed in accordance with the present invention.
Figure 2:
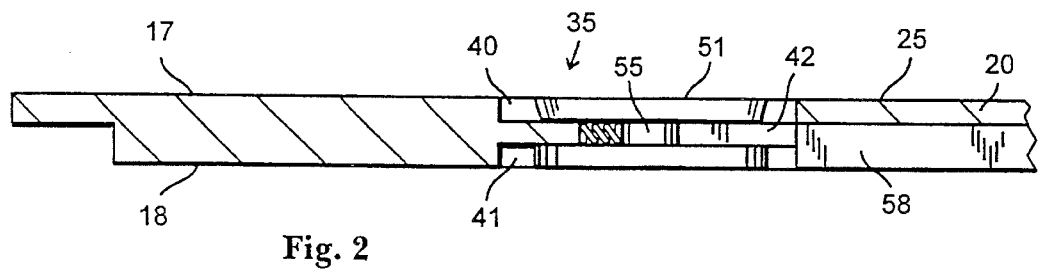
FIG. 2 is a cross-sectional view of the substrate retention fixture as seen from the line 2—2 of FIG. 1.

Turning now to the drawings in which like reference characters indicate corresponding elements, attention is first directed to FIGS. 1 and 2 which illustrate a substrate retention fixture 10 in accordance with the present invention. Substrate retention fixture 10 includes a base 15 which is generally rectangularly shaped and in this specific embodiment is substantially square. Further, base 15 is formed of a generally flat plate of material, i.e. flat with an upper major surface 17 and a lower major surface 18. The material from which base 15 is formed may be a hard fiberboard material, a metal such as aluminum, or any other suitable material which is stiff and hard enough to withstand a reasonable number of cycles of operations.

A substrate receiving area is defined in base 15 which can simply be a portion of upper surface 17 of base 15 or which can be a cavity 20, as illustrated in this embodiment. Cavity 20 is formed in the upper surface 17 of base 10, which cavity 20 is substantially rectangular in this specific embodiment. Cavity 20 is formed to receive a substrate, such as printed circuit board 25, therein with a lower surface of printed circuit board 25 lying on a lower surface of cavity 20 and an upper surface exposed for the performance of various assembling and testing operations thereon. Cavity 20 has outer dimensions only slightly larger than printed circuit board 25 so that printed circuit board 25 fits easily therein and openings 26 and 27 are positioned to receive alignment pins 28 and 29, respectively, therein and to accurately align printed circuit board 25 in the correct position relative to base 15. In this specific embodiment alignment pins 28 and 29 are accurately positioned and affixed to base 15 within cavity 20. Base 15 can also have some alignment devices, such as openings therethrough from the lower surface to the upper surface (not shown) or any or all of edges 30, 31 and 32, for aligning base 15 relative to some automatic machine in which base 15 and aligned printed circuit board 25 are to be utilized.

Figure 3:
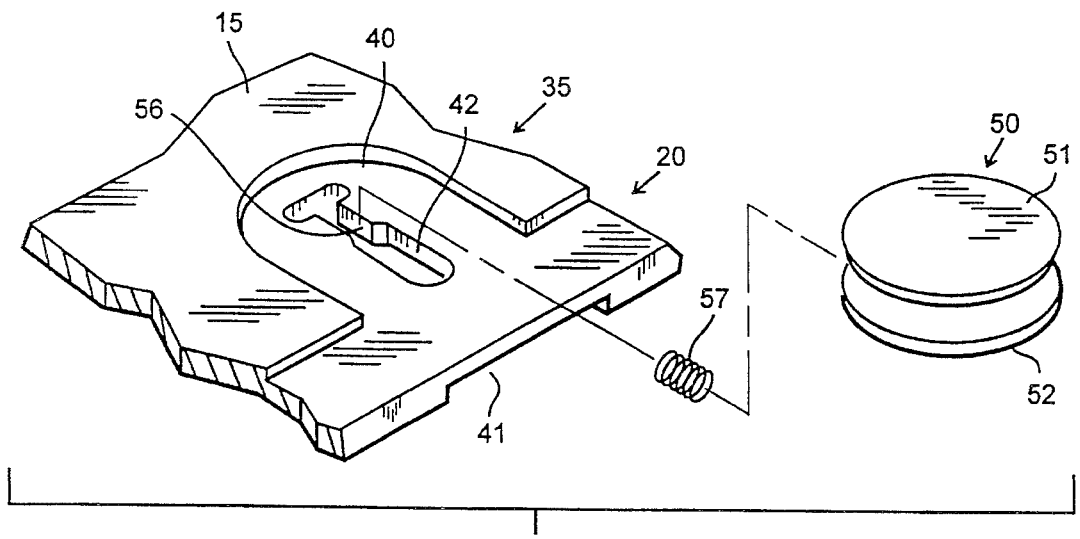
FIG. 3 is an enlarged and exploded perspective view of a portion of the substrate retention fixture of FIG. 1.

Base 15 further has a plurality of openings 35 and 36 in the upper surface 17 thereof which are formed in communication with cavity 20. Because openings 35 and 36 are substantially similar, only opening 35 will be discussed in detail herein. Referring specifically to FIG. 3, a greatly enlarged perspective view of opening 35 is illustrated in detail, portions thereof broken away and shown in section. From FIGS. 2 and 3, it can be seen that opening 35 includes a semi-elliptical depression 40 in the upper surface of base 15 and in communication with cavity 20. An elliptical, or slightly longer partially elliptical, depression 41 is formed in lower surface 18 of base 15, generally concentrically oriented relative to semi-elliptical depression 40. A communicating opening 42 is formed through base 15 in communication with semi-elliptical depression 40 and elliptical depression 41. Communicating opening 42 is elongated horizontally and extends from adjacent the inner walls of semi-elliptical depression 40 and elliptical depression 41 to a position underlying a portion of cavity 20.

A plurality of spools 50 are positioned, one in each opening 35 and 36, however, only spool 50 in opening 35 will be discussed herein to simplify the disclosure. Spool 50 includes upper and lower disk shaped flanges 51 and 52, respectively, affixed to opposite ends of a central body member 55. One of disk shaped flanges 51 and 52 may have, for example, an axially extending rivet which, upon being riveted in a well known manner, fixedly attaches disk shaped flanges 51 and 52 together and forms body member 55, or one of disk shaped flanges 51 and 52 may include an externally threaded and axially attached shaft and the other of disk shaped flanges 51 and 52 includes an internally threaded and axially attached shaft, formed to threadedly engage the externally threaded shaft and form central body member 55.

In the fabrication of substrate retention fixture 10, disk shaped flange 51 or 52 (e.g. disk shaped flange 51) is positioned in depression 40 and the other disk shaped flange 52 is positioned in depression 41. The body portions are engaged through communicating opening 42 to fixedly attach them together and to form body member 55 engaged in communicating opening 42. Communicating opening 42 has a necked down portion 56 which is not as wide as the remainder of communicating opening 42 and which has a compression spring 57 positioned therein during the assembly of spool 50. The sides of necked down portion 56 and disk shaped flanges 51 and 52 cooperate to maintain spring 57 positioned in necked down portion 56 of communicating opening 42. It can readily be seen that spool 50 is fixedly engaged in communicating opening 42 and is movable therein between a first position (upper left in FIG, 3 or left in FIG. 2) in which the spool is disengaged from substrate 25 positioned in cavity 20 and a second position (lower right in FIG, 3 or right in FIG. 2) in which at least an edge of spool 50 is frictionally engaged with substrate 25 positioned in cavity 20.

Thus, to fixedly engage substrate 25 in cavity 20 for further operations, openings 26 and 27 are positioned over pins 28 and 29, respectively, and substrate 25 is positioned in cavity 20, as nearly as possible. The spools 50 are moved, simultaneously or one at a time, to the lower left in FIG. 1 to allow substrate 25 to be positioned in cavity 20 with the lower surface thereof substantially in contact with the lower surface of cavity 20. In this position, spring 57 biases an edge of disk shaped flange 51 into frictional engagement with an edge of substrate 25 for both spools 50, and both spools 50 cooperate to maintain substrate 25 fixedly engaged in cavity 20. It should be noted from FIG. 2 that upper disk shaped flange 51 is positioned so that no portion of either of spools 50 extends above the surface of substrate 25 to interfere with subsequent operations. It should be noted that a portion 58 (see FIG. 2) of the bottom of cavity 20 extends completely through base 15. Thus, to disengage substrate 25 from substrate retention fixture 10, the operator simply presses on the bottom surface of substrate 25 through portion 58. Also, operations can be performed on the backside of substrate 25 through portion 58, if desired or necessary.

Substrate retention fixture 10 utilizes a compression type of retention and has been found to be most valuable to retain substrates that are thick enough versus their square area to be retained with compressive forces without objectionable bending or bowing. A typical application for this type of retention device is surface mount printed circuit board automated assembly. In this type of automation, the first process is screen printing. In screen printing no part of the retention fixture can extend above the top surface of the substrate or printed circuit board.

In a somewhat modified embodiment, the upper disk shaped flanges of the spools are constructed with a stepped or beveled edge and the upper surface extends a short distance above the upper surface of the substrate. Thus, the upper surface of the upper disk shaped flange engages the upper surface of the substrate and provides a greater holding action. This type of retention fixture is well suited for spray clean applications where there may be excessive force trying to push the substrate out of the retention fixture.

Figure 4:
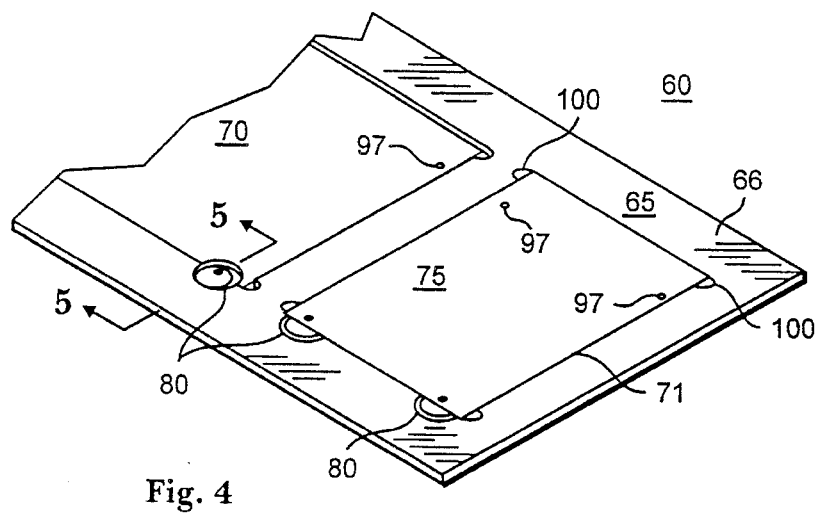
FIG. 4 is a perspective view of another embodiment of a substrate retention fixture constructed in accordance with the present invention.
Figure 5:
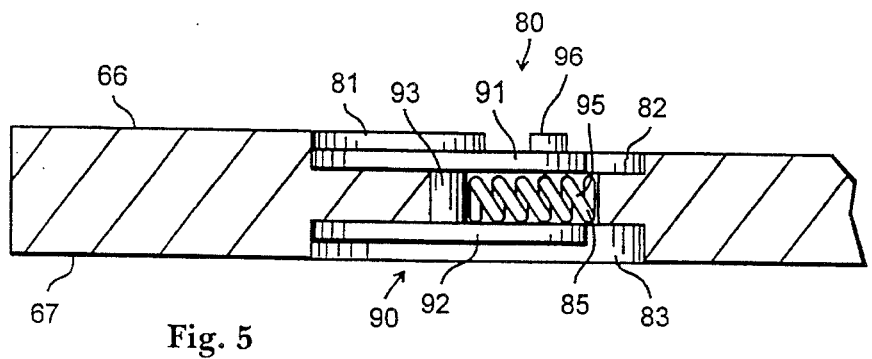
FIG. 5 is a cross-sectional view of the substrate retention fixture as seen from the line 5—5 of FIG. 4.

Referring specifically to FIGS. 4 and 5, a second embodiment of a substrate retention fixture 60 is illustrated in accordance with the present invention. Substrate retention fixture 60 includes a base 65 with upper and lower major surfaces 66 and 67, respectively. A plurality of generally rectangularly shaped cavities 70, 71, etc. are formed in substrate retention fixture 60 from upper major surface 66. A substrate 75 is positioned in cavity 71, in FIG. 4, while cavity 70 remains empty for convenience of illustration. Each cavity 70, 71, etc. has a pair of similar openings positioned in communication therewith, with each opening herein designated 80 for convenience.

Figure 6:
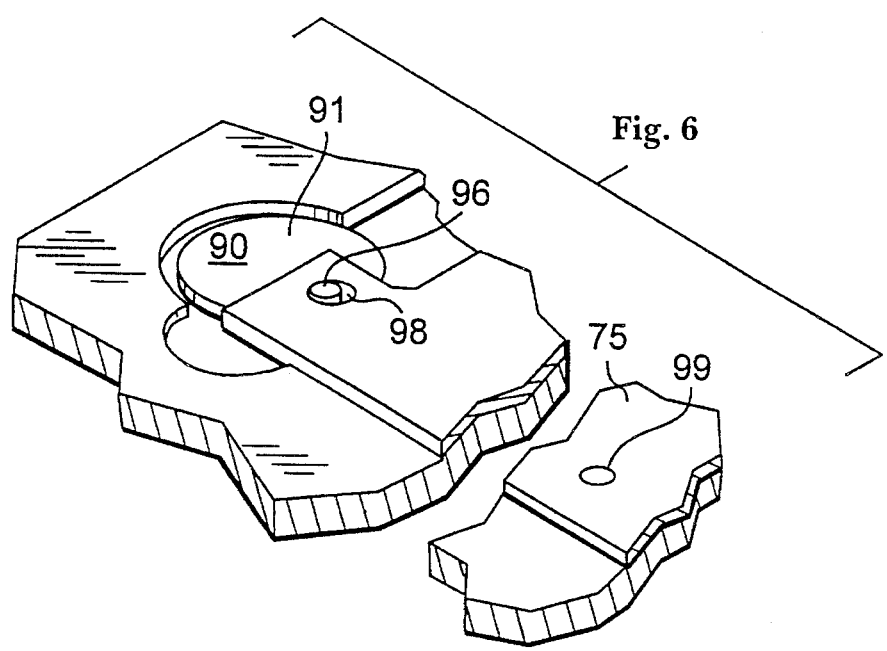
FIG. 6 is an enlarged and exploded perspective view of a portion of the substrate retention fixture of FIG. 4.
Figure 7:
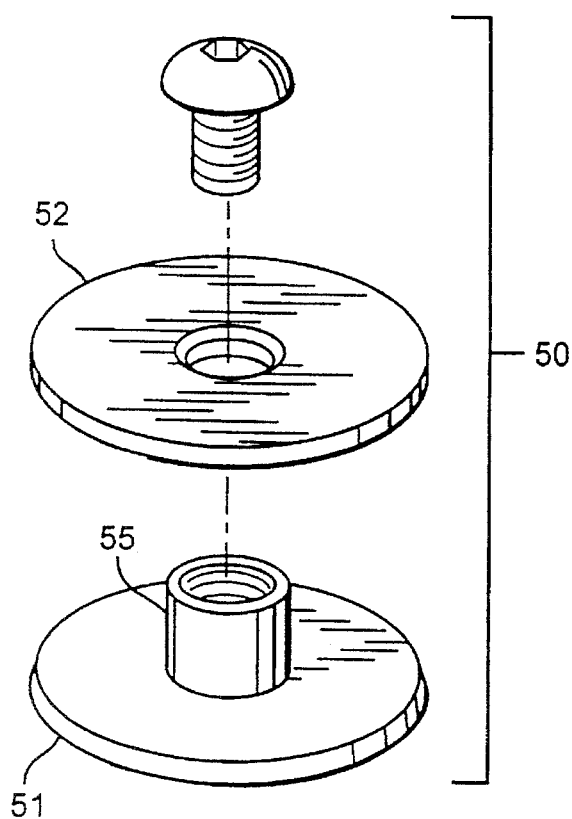
FIG. 7 shows the structure of a spool using a threaded connection.
Figure 8:
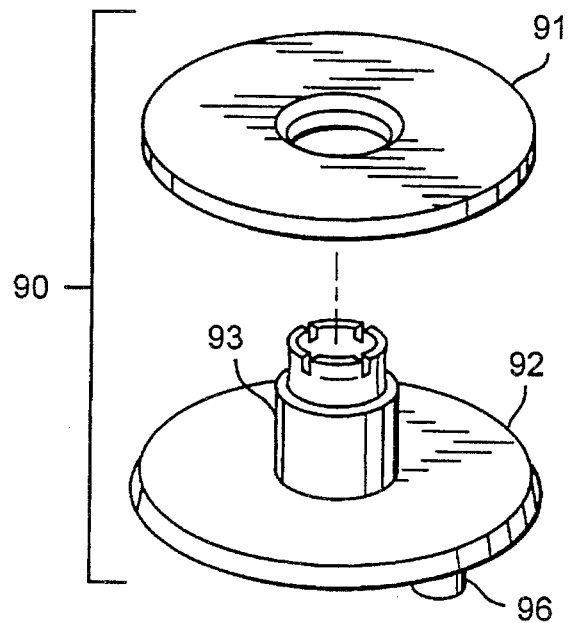
FIG. 8 shows the structure of a spool using a rivet connection.

Since all of openings 80 are substantially similar, only one opening 80 will be discussed in detail. From FIGS. 5 and 6, it can be seen that opening 80 includes a semi-elliptical depression 81 in upper surface of base 65 in combination with an elliptical depression 82 in upper surface 66 of base 65 and deeper into base 65 than cavity 70. Thus, the surface of elliptical depression 82 is lower than the surface of cavity 70. Combined depressions 81 and 82 are concentric and in communication with cavity 70. An elliptical depression 83 is formed in lower surface 67 of base 65, generally concentrically oriented relative to combined depressions 81 and 82. A communicating opening 85 is formed through base 65 in communication with combined depressions 81 and 82 and elliptical depression 83. Communicating opening 85 is elongated horizontally and extends from approximately a center point of combined depressions 81 and 82 and elliptical depression 83 to a position underlying a portion of cavity 65.

A plurality of spools 90 are positioned, one in each opening 80, however, only one spool 90 in opening 80 will be discussed herein to simplify the disclosure. Spool 90 includes upper and lower disk shaped flanges 91 and 92, respectively, affixed to opposite ends of a central body member 93. One of disk shaped flanges 91 and 92 may have, for example, an axially extending rivet which, upon being riveted in a well known manner fixedly attaches disk shaped flanges 91 and 92 together and forms body member 93, or one of disk shaped flanges 91 and 92 may include an externally threaded and axially attached shaft and the other of disk shaped flanges 91 and 92 includes an internally threaded and axially attached shaft, formed to threadedly engage the externally threaded shaft and form central body member 93.

In the fabrication of substrate retention fixture 60, disk shaped flange 91 or 92 (e.g. disk shaped flange 91) is positioned in depression 82 of combined depression 81, 82 and the other disk shaped flange 92 is positioned in depression 83. The body portions are engaged through communicating opening 85 to fixedly attach them together and to form body member 93 engaged in communicating opening 85. Communicating opening 85 has a compression spring 95 positioned therein during the assembly of spool 90. The sides of communicating opening 85 and disk shaped flanges 91 and 92 cooperate to maintain spring 95 positioned in communicating opening 85.

Further, each spool 90 has an alignment pin 96 affixed to the upper surface of upper disk shaped flange 91. Alignment pin 96 extends vertically upwardly from the upper surface of upper disk shaped flange 91 so as to be approximately level with upper surface 66 of base 65. Additional alignment pins 97 are positioned in cavities 70, 71, etc. and also extend vertically upwardly to approximately flush with surface 66 of base 65. In this particular embodiment, substrate retention fixture 60 is designed to receive substrates 75 having openings 98 and 99 formed therein, which openings 98 and 99 receive alignment pins 96 and 97, respectively, therein when substrate 75 is correctly aligned within cavity 70, 71, etc. It should be noted that substrate retention fixture 60 is specifically designed so that alignment pins 96 and 97 are flush with or below surface 66 so that they do not catch on foreign objects during use, storage, etc.

It can readily be seen that spool 90 is fixedly engaged in communicating opening 85 and is movable therein between a first position (upper right in FIG, 6 or left in FIG. 5) in which spool 90 is disengaged from substrate 75 positioned in cavity 71 and a second position (lower right in FIG, 6 or right in FIG. 5) in which at least alignment pin 96 of spool 90 is engaged in opening 98 of substrate 75 positioned in cavity 71.

Thus, to fixedly engage substrate 75 in cavity 70, 71, etc. for further operations, openings 98 are positioned over alignment pins 96 on spools 90 and substrate 75 is positioned in cavity 71, as nearly as possible. The spools 90 are moved, simultaneously to the lower right in FIG. 6 to allow opening 99 to engage alignment pins 97 and substrate 75 to be positioned in cavity 70 with the lower surface thereof substantially in contact with the lower surface of cavity 70. In this position, springs 95 bias spools 90 in a direction away from cavity 70, 71, etc. and both spools 90 cooperate to maintain substrate 75 fixedly engaged in cavity 20. It should be noted from FIG. 5 that upper disk shaped flange 91 is approximately the same thickness as depression 82 so that spools 90 do not extend into cavity 70, 71, etc. to interfere with subsequent operations. Substrate 75 can be quickly disengaged from substrate retention fixture 60 by inserting a finger or fingernail into semicircular openings 100 provided at each corner of cavity 70, 71, etc. Also, portions of cavities 70. 71 etc. can extend completely through base 65 to allow access to the lower side of substrate 75, if desired or necessary.

In substrate retention fixture 60 spools 90 are producing a stretching or tension force on substrate 75. This type of retention fixture is especially adaptable to very thin substrates. It should be noted that spools 90 are mounted for 360° rotation and actually pull away from each other, rather than pulling parallel to each other on substrate 75.

Accordingly, an improved substrate retention fixture is disclosed which is relatively simple to operate and can be used to retain substrates with different sizes and shapes. Further, the improved substrate retention fixture is simpler and less expensive to fabricate than other work holders and is lighter than prior art work holders. Because the base of the retention fixture can be made substantially any size or shape, the substrate retention fixture can be used with a variety of modern automated machines so that the substrate retention fixture is more versatile than prior art work holders. The exterior size and configuration of the retention fixture is designed to satisfy specific automation, or hand, equipment while the interior cavity is configured to retain one or more substrates based on the substrate size versus overall fixture size and requirements.

Several advantages of the disclosed substrate retention fixture are the fact that they can be constructed to hold substrates in compression or tension, which allows the retention of virtually any substrates from extra thick to extra thin. Also, the spools which provide the retention have a relatively large surface area to distribute the retention force over a larger area of the substrate. Further, because the spools rotate 360°, there is a relatively large wear surface area extending completely around the circumference of the upper disk shaped flanges of each spool. Also, because the spools rotate and the alignment pins are mounted in the upper disk shaped flange of the spool in at least one embodiment, the alignment pins are self-aligning, further simplifying the use of the retention fixture.

Various modifications and changes to the embodiments herein chosen for purposes of illustration will readily occur to those skilled in the art. For example, spools 50 and 90 can be formed and assembled in a variety of ways while still performing the stated functions. Further, a variety of different materials may be utilized to form base 15 and 85 and the cavities and various openings may be fabricated in a variety of somewhat modified and/or interchanged steps.

The foregoing is given by way of example only. Other modifications and variations may be made by those skilled in the art without departing from the scope of the invention as defined by the following claims.

Having fully described and disclosed the present invention and preferred embodiments thereof in such clear and concise terms as to enable those skilled in the art to understand and practice same, the invention claimed is:

1. A substrate retention fixture comprising:

a base having a substrate receiving cavity therein with a plurality of openings adjacent the cavity and in communication therewith;

a plurality of spools, one each positioned in each opening of the plurality of openings, with each spool being slideably mounted within the opening for movement between a first position in which the spool is disengaged from a substrate positioned in the cavity and a second position in which at least an edge of the spool is frictionally engaged with a substrate positioned in the cavity;

a plurality of springs, one each positioned in each opening of the plurality of openings, the spring in each opening engaged with the spool in the opening and biasing the spool into the second position; and an alignment pin mounted on the base within the area for engaging and aligning a substrate received in the area.

2. A substrate retention fixture as claimed in claim 1 wherein the substrate receiving area in the base is formed to expose at least a portion of each major surface of a substrate positioned therein for the performance of operations thereon.

3. A substrate retention fixture comprising:

a base having a substrate receiving cavity therein with a plurality of openings adjacent the cavity and in communication therewith;

a plurality of spools, one each positioned in each opening of the plurality of openings, with each spool being slideably mounted within the opening for movement between a first position in which the spool is disengaged from a substrate positioned in the cavity and a second position in which at least an edge of the spool is frictionally engaged with a substrate positioned in the cavity;

a plurality of springs, one each positioned in each opening of the plurality of openings, the spring in each opening engaged with the spool in the opening and biasing the spool into the second position; and alignment pins mounted one each on each spool and moveable therewith.

4. A substrate retention fixture comprising:

a base having a substrate receiving cavity therein with a plurality of openings adjacent the cavity and in communication therewith;

a plurality of spools, one each positioned in each opening of the plurality of openings, with each spool being slideably mounted within the opening for movement between a first position in which the spool is disengaged from a substrate positioned in the cavity and a second position in which at least an edge of the spool is frictionally engaged with a substrate positioned in the cavity and wherein each spool of the plurality of spools includes upper and lower disk shaped flanges joined by a central body member and wherein one of the upper and lower disk shaped flanges includes an externally threaded shaft and the other of the upper and lower disk shaped flanges includes an internally threaded shaft formed to threadedly engage the externally threaded shaft and form the central body member; and a plurality of springs, one each positioned in each opening of the plurality of openings, the spring in each opening engaged with the spool in the opening and biasing the spool into the second position.

5. A substrate retention fixture comprising:

a base having a substrate receiving cavity therein with a plurality of openings adjacent the cavity and in communication therewith;

a plurality of spools, one each positioned in each opening of the plurality of openings, with each spool being slideably mounted within the opening for movement between a first position in which the spool is disengaged from a substrate positioned in the cavity and a second position in which at least an edge of the spool is frictionally engaged with a substrate positioned in the cavity and wherein each spool of the plurality of spools includes upper and lower disk shaped flanges joined by a central body member and wherein the upper and lower disk shaped flanges are affixed to the central body member by a rivet; and a plurality of springs, one each positioned in each opening of the plurality of openings, the spring in each opening engaged with the spool in the opening and biasing the spool into the second position.

6. A substrate retention fixture as claimed in claim 1 wherein the base is formed of fiberboard.

7. A substrate retention fixture as claimed in claim 1 wherein the base is formed of metal.

8. A substrate retention fixture as claimed in claim 7 wherein the base is formed of aluminum.

9. A substrate retention fixture comprising:

a base formed of a relatively flat plate having upper and lower major surfaces, the base further having a substrate receiving cavity formed in the upper major surface thereof with a plurality of openings adjacent the cavity and in communication therewith;

a plurality of spools, one each positioned in each opening of the plurality of openings, with each spool being slideably mounted within the opening for movement between a first position in which the spool is disengaged from a substrate positioned in the cavity and a second position in which at least an edge of the spool is frictionally engaged with a substrate positioned in the cavity, and each spool includes upper and lower disk shaped flanges joined by a central body member;

a plurality of springs, one each positioned in each opening of the plurality of openings, the spring in each opening engaged with the spool in the opening and biasing the spool into the second position; and alignment means formed to engage and align a substrate positioned in the cavity, the alignment means being mounted on one of the base and the plurality of spools;

wherein the plurality of openings adjacent the cavity and in communication therewith include a semi-elliptically shaped depression in the upper major surface of the base and in communication with the cavity, the semi-elliptically shaped depression being formed to receive the upper disk shaped flange of one of the plurality of spools therein, an elliptically shaped depression in the lower major surface of the base, the elliptically shaped depression being formed to receive the lower disk shaped flange of the one of the plurality of spools therein, and a communicating opening through the base from the semi-elliptically shaped depression to the elliptically-shaped depression and formed to receive the body member of the one of the plurality of spools.

10. A substrate retention fixture as claimed in claim 9 wherein the substrate receiving area formed in the upper major surface of the base extends through the base in at least some portions of the area to the lower major surface of the base so that a substrate positioned in the area and frictionally engaged by the plurality of spools is accessible from the upper and lower major surfaces of the base.

11. A substrate retention fixture as claimed in claim 9 wherein one of the springs of the plurality of springs is positioned in the communicating opening and partially compressed between the base and the body member.

12. A substrate retention fixture comprising:

a base formed of a relatively flat plate having upper and lower major surfaces, the base further having a substrate receiving cavity formed in the upper major surface thereof with a plurality of openings adjacent the cavity and in communication therewith;

a plurality of spools, one each positioned in each opening of the plurality of openings; with each spool being slideably mounted within the opening for movement between a first position in which the spool is disengaged from a substrate positioned in the cavity and a second position in which at least an edge of the spool is frictionally engaged with a substrate positioned in the cavity;

a plurality of springs, one each positioned in each opening of the plurality of openings, the spring in each opening engaged with the spool in the opening and biasing the spool into the second position; and alignment means formed to engage and align a substrate positioned in the cavity, the alignment means being mounted on one of the base and the plurality of spools; wherein the alignment means includes alignment pins mounted on the base within the cavity.

13. A substrate retention fixture comprising:

a base formed of a relatively flat plate having upper and lower major surfaces, the base further having a substrate receiving cavity formed in the upper major surface thereof with a plurality of openings adjacent the cavity and in communication therewith;

a plurality of spools, one each positioned in each opening of the plurality of openings, with each spool being slideably mounted within the opening for movement between a first position in which the spool is disengaged from a substrate positioned in the cavity and a second position in which at least an edge of the spool is frictionally engaged with a substrate positioned in the cavity;

a plurality of springs, one each positioned in each opening of the plurality of openings, the spring in each opening engaged with the spool in the opening and biasing the spool into the second position; and alignment means formed to engage and align a substrate positioned in the cavity, the alignment means being mounted on one of the base and the plurality of spools wherein the alignment means includes alignment pins mounted one each on each spool and moveable therewith.

14. A substrate retention fixture as claimed in claim 13 wherein the alignment means further includes alignment pins mounted on the base within the area.

* * * * *